US012751149B2

(12) United States Patent
Jin

(10) Patent No.: US 12,751,149 B2
(45) Date of Patent: Sep. 29, 2026

(54) DISPLAY DEVICE AND METHOD OF FABRICATING THE SAME

(71) Applicant: Samsung Display Co., LTD., Yongin-si (KR)

(72) Inventor: Dong Gyu Jin, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 450 days.

(21) Appl. No.: 18/447,016

(22) Filed: Aug. 9, 2023

(65) Prior Publication Data

US 2024/0147771 A1 May 2, 2024

(30) Foreign Application Priority Data

Oct. 31, 2022 (KR) ........................ 10-2022-0142534

(51) Int. Cl.
*H10K 59/122* (2023.01)
*H10K 59/12* (2023.01)
*H10K 59/80* (2023.01)

(52) U.S. Cl.
CPC ....... *H10K 59/122* (2023.02); *H10K 59/1201* (2023.02); *H10K 59/8792* (2023.02)

(58) Field of Classification Search
CPC ........................... H10K 59/122; H01J 59/1201
See application file for complete search history.

(56) References Cited

U.S. PATENT DOCUMENTS 8,963,138 B2 2/2015 Lim et al.
10,937,995 B2 3/2021 Xia et al.
2005/0087769 A1* 4/2005 Yamazaki .............. H10D 86/60 257/202
2024/0244893 A1* 7/2024 Kil ....................... H10K 59/122

FOREIGN PATENT DOCUMENTS

CN 109301078 B * 1/2022 ............. H10K 71/40
CN 114420877 A * 4/2022 ........... H10K 59/122
JP 4785339 B2 7/2011
KR 10-2020-0027792 A 3/2020

OTHER PUBLICATIONS

Reinold et al., *Simultaneous doping and crosslinking of polythiophene films*, Polymer Chemistry, The Royal Society of Chemistry 2017, Nov. 21, 2017, 9 pages.

* cited by examiner

*Primary Examiner* — Mariceli Santiago
(74) *Attorney, Agent, or Firm* — Womble Bond Dickinson (US) LLP

(57) ABSTRACT

A display device and a method of fabricating the same are provided. The display device comprises a substrate, a via layer on the substrate, an anode electrode on the via layer, a pixel-defining film on the via layer and the anode electrode, and exposing a portion of the anode electrode, an organic layer on the anode electrode, and a cathode electrode on the organic layer, wherein the pixel-defining film comprises a first region containing boron, and a second region other than the first region.

19 Claims, 21 Drawing Sheets

DISPLAY DEVICE AND METHOD OF FABRICATING THE SAME

CROSS-REFERENCE TO RELATED APPLICATION

This application claims priority to and the benefit of Korean Patent Application No. 10-2022-0142534 filed on Oct. 31, 2022 in the Korean Intellectual Property Office, the disclosure of which is incorporated herein by reference in its entirety.

BACKGROUND

1. Field

The present disclosure relates to a display device and a method of fabricating the same.

2. Description of the Related Art

As the information-oriented society evolves, various demands for display devices are ever increasing. For example, display devices are being employed by a variety of electronic devices such as smart phones, digital cameras, laptop computers, navigation devices, and/or smart televisions.

Display devices may be flat panel display devices such as a liquid-crystal display device, a field emission display device, and a light-emitting display device. Light-emitting display devices include an organic light-emitting display device including organic light-emitting elements, an inorganic light-emitting display device including inorganic light-emitting elements such as inorganic semiconductor, and a micro light-emitting display device including micro light-emitting elements.

Among these, an organic light-emitting display device may include an anode electrode and a cathode electrode facing and/or overlapping each other, and an emissive layer interposed therebetween. Electrons and holes supplied from the anode electrode and the cathode electrode are recombined in the emissive layer to generate excitons, and the generated excitons relax (decay) from the excited state to the ground state so that light can be emitted.

Although organic light-emitting display devices are in the limelight as self-luminous display devices, there is a shortcoming in that the display quality is deteriorated due to the reflection of external light. In view of the above, research to improve the issue of reflection of external light is ongoing.

SUMMARY

Aspects of the present disclosure relate to a display device capable of preventing or reducing reflection of external light and a decrease in color gamut due to external light, and a method of fabricating the same.

It should be noted that aspects of the present disclosure are not limited to the above-mentioned aspect; and other aspects of the present disclosure will be apparent to those skilled in the art from the following descriptions.

According to an embodiment of the present disclosure, a display device includes a substrate, a via layer on the substrate, an anode electrode on the via layer, a pixel-defining film on the via layer and the anode electrode, and exposing a portion of the anode electrode, an organic layer on the anode electrode, and a cathode electrode on the organic layer, wherein the pixel-defining film includes a first region containing boron, and a second region other than the first region.

In an embodiment, the first region is adjacent to the cathode electrode, and the second region is adjacent to the anode electrode.

In an embodiment, the first region is not in contact with a top surface of the via layer, and the second region is in contact with the top surface of the via layer.

In an embodiment, the first region covers the second region.

In an embodiment, a thickness of the second region is larger than a thickness of the first region.

In an embodiment, a thickness of the first region is in a range of 0.005% to 0.025% of a thickness of the pixel-defining film.

In an embodiment, an optical density of the pixel-defining film is in a range of 0.7 to 1.

In an embodiment, the first region forms a concentration gradient in which a concentration of the boron decreases from a surface of the pixel-defining film to the second region.

In an embodiment, the pixel-defining film has an opening exposing a portion of the anode electrode, and the first region includes an inner circumferential surface of the opening.

In an embodiment, the first region is disposed parallel to a top surface of the via layer.

In an embodiment, the pixel-defining film has an opening exposing a portion of the anode electrode, and the second region includes at least part of an inner circumferential surface of the opening.

According to an embodiment of the present disclosure, a method of fabricating a display device includes forming a via layer on a substrate, forming an anode electrode on the via layer, forming an organic material layer on the via layer and the anode electrode, patterning the organic material layer to form a pixel-defining film exposing the anode electrode, doping the pixel-defining film with boron, forming an organic layer on the anode electrode, and forming a cathode electrode on the organic layer.

In an embodiment, the doping the pixel-defining film with boron includes forming a first region of the pixel-defining film that is doped with boron, and a second region that is not doped with the boron.

In an embodiment, a dose of the boron is in a range of 5 $E15/cm^2$ to 1 $E16/cm^2$.

In an embodiment, the doping the pixel-defining film with boron includes doping the boron at an acceleration voltage of 10 KeV to 20 KeV.

According to an embodiment of the present disclosure, a method of fabricating a display device includes forming a via layer on a substrate, forming an anode electrode on the via layer, forming an organic material layer on the via layer and the anode electrode, doping the organic material layer with boron, patterning the organic material layer to form a pixel-defining film exposing the anode electrode, forming an organic layer on the anode electrode, and forming a cathode electrode on the organic layer.

In an embodiment, the doping the organic material layer with the boron includes forming a first region of the organic material layer that is doped with the boron, and a second region that is not doped with the boron.

In an embodiment, the first region is formed parallel to a top surface of the via layer.

In an embodiment, a dose of the boron is in a range of 5 $E15/cm^2$ to 1 $E16/cm^2$.

In an embodiment, the doping the organic material layer with boron includes doping the boron at an acceleration voltage of 10 KeV to 20 KeV.

According to an embodiment of the present disclosure, by doping a pixel-defining film with ions in a display device, a first region doped with the ions on a surface of the pixel-defining film and a second region not doped with the ions may be formed. By doping the pixel-defining film with the ions to form the first region exhibiting a black color, it is possible to prevent or reduce reflection of external light by absorbing external light. Accordingly, it is possible to prevent or reduce a decrease in color gamut and to improve the issue of leakage current of a transistor due to external light.

It should be noted that aspects of the present disclosure are not limited to those described above and other aspects of the present disclosure will be apparent to those skilled in the art from the following descriptions.

BRIEF DESCRIPTION OF THE DRAWINGS

The above and other aspects and features of the present disclosure will become more apparent by describing in more detail embodiments thereof with reference to the attached drawings, in which.

DETAILED DESCRIPTION

Figure 1:
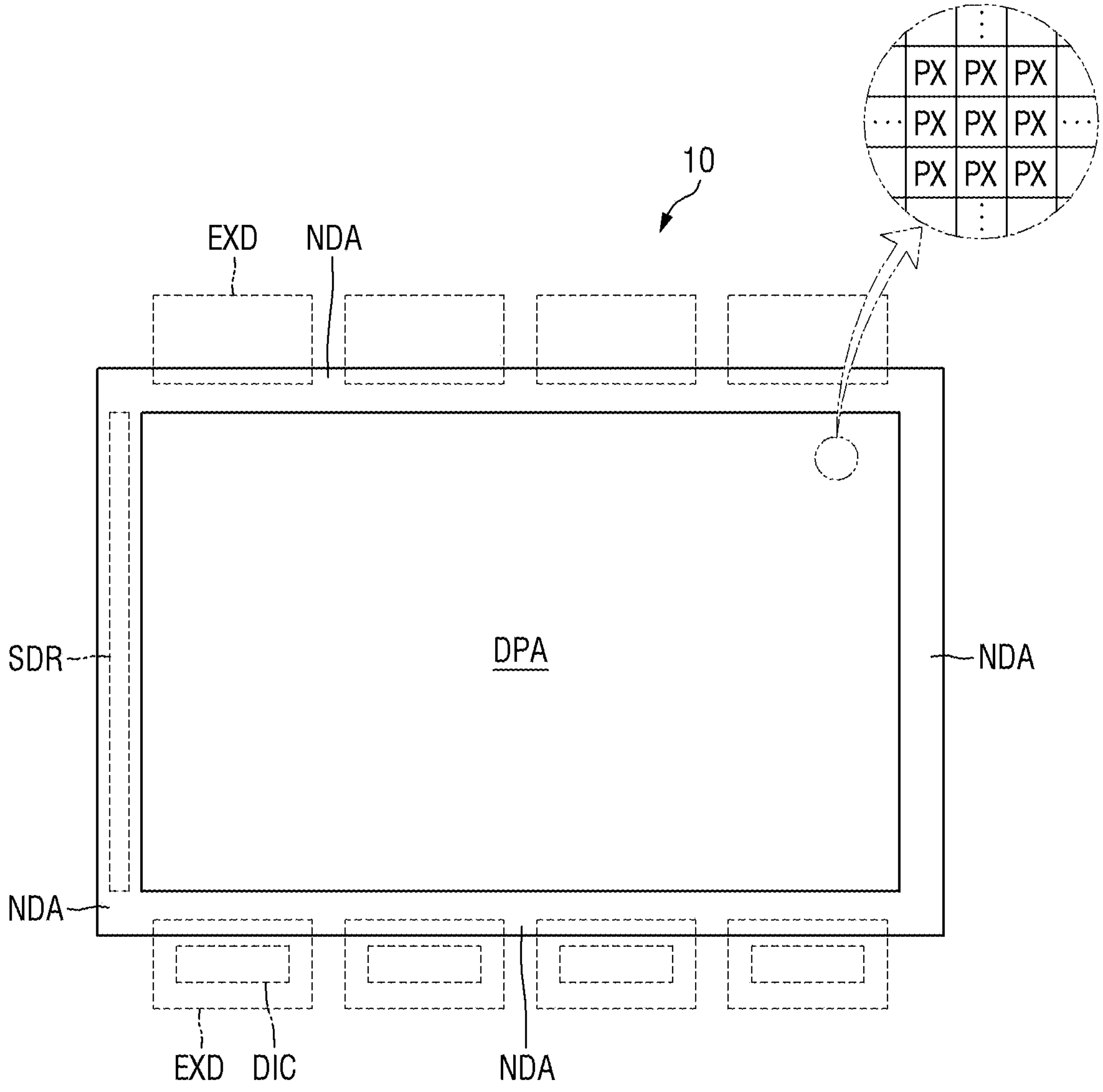
FIG. 1 is a plan view of a display device according to an embodiment of the present disclosure.

The present disclosure will now be described more fully hereinafter with reference to the accompanying drawings, in which example embodiments of the present disclosure are shown. This present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present disclosure refers to "one or more embodiments of the present disclosure."

Also, the terms "approximately" and similar terms, when used herein in connection with a numerical value or a numerical range, are inclusive of the stated value and mean within an acceptable range of deviation for the particular value as determined by one of ordinary skill in the art, considering the measurement in question and the error associated with measurement of the particular quantity (e.g., the limitations of the measurement system). For example, "approximately" may mean within one or more standard deviations, or within ±30%, 20%, 10%, 5% of the stated value.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

It will also be understood that when a layer is referred to as being "on" another layer or substrate, it can be directly on the other layer or substrate, or one or more intervening layers may also be present. The same reference numbers indicate the same or similar components throughout the specification.

It will be understood that, although the terms "first," "second," etc. may be utilized herein to describe one or more suitable elements, these elements should not be limited by these terms. These terms are only utilized to distinguish one element from another element. For instance, a first element discussed could be termed a second element without departing from the teachings of the present disclosure. Similarly, the second element could also be termed the first element.

Each of the features of the one or more suitable embodiments of the present disclosure may be combined or combined with each other, in part or in whole, and technically one or more suitable interlocking and driving are possible. Each embodiment may be implemented independently of each other or may be implemented together in an association.

Hereinafter, embodiments of the present disclosure will be described with reference to the accompanying drawings.

FIG. 1 is a plan view of a display device according to an embodiment of the present disclosure.

Referring to FIG. 1, a display device 10 according to an embodiment of the present disclosure may be applied to, a smart phone, a mobile phone, a tablet PC, a personal digital assistant (PDA), a portable multimedia player (PMP), a television set, a game machine, a wristwatch-type or -kind electronic device, a head-mounted display, a personal computer monitor, a laptop computer, a car navigation system, a car instrument cluster, a digital camera, a camcorder, an outdoor billboard, an electronic billboard, one or more suitable medical apparatuses, one or more suitable home appliances such as a refrigerator and a laundry machine, Internet of things (IoT) devices, etc. In the following description, a television (TV) is described as an example of the display device. A TV may have a high resolution or ultra high resolution such as HD, UHD, 4K and/or 8K.

In some embodiments, the display device 10 according to the embodiments may be variously and suitably classified by the way in which images are displayed. Examples of the classification of display devices may include an organic light-emitting display device (OLED), an inorganic light-emitting display device (inorganic EL), a quantum-dot light-emitting display device (QED), a micro LED display device (micro-LED), a nano LED display device (nano-LED), a plasma display device (PDP), a field emission display device (FED) and a cathode ray display device (CRT), a liquid-crystal display device (LCD), an electrophoretic display device (EPD), etc. In the following description, an organic light-emitting display device will be described as an example of the display device, and the organic light-emitting display device will be simply referred to as a display device unless it is necessary to discern it from others. It is, however, to be understood that the embodiments of the present disclosure are not limited to the organic light-emitting display device, and one of the above-listed display devices or any other suitable display device generally available in the art may be employed without departing from the scope of the present disclosure.

According to an embodiment of the present disclosure, the display device 10 may have a square shape, e.g., a rectangular shape when viewed from the top. When the display device 10 is a television, it is oriented such that the longer sides are positioned in the horizontal direction. It should be understood, however, that the present disclosure is not limited thereto. The longer side may be positioned in the vertical direction. In some embodiments, the display device 10 may be installed rotatably so that the longer sides are positioned or position-able in the horizontal or vertical direction variably.

The display device 10 may include a display area DPA and a non-display area NDA. The display area DPA may be an active area where images are to be displayed. The display area DPA may have, but is not limited to, a rectangular shape similar to the general shape of the display device 10 when viewed from the top (e.g., in a plan view).

The display area DPA may include a plurality of pixels PX. The plurality of pixels PX may be arranged in a matrix. The shape of each of the pixels PX may be, but is not limited to, a rectangle or a square when viewed from the top. Each of the pixels PX may have a diamond shape having sides inclined with respect to a side of the display device 10. The plurality of pixels PX may include different color pixels PX. For example, the plurality of pixels PX may include, but is not limited to, a red first color pixel PX, a green second color pixel PX, and a blue third color pixel PX. The stripe-type or kind pixels and PENTILE® (Trademark of Samsung Display Co., Ltd.) type or kind pixels may be arranged alternately. For example, red, green, and blue pixels may be arranged in an RGBG matrix structure.

The non-display area NDA may be disposed around the display area DPA. The non-display area NDA may surround the display area DPA entirely or partially. The display area DPA may have a rectangular shape, and the non-display area NDA may be disposed to be adjacent to the four sides of the display area DPA. The non-display area NDA may form the bezel of the display device 10.

In the non-display areas NDA, a driving circuit and/or a driving element for driving the display area DPA may be disposed. According to an embodiment of the present disclosure, a pad area is disposed on the display substrate of the display device 10 in a first non-display area NDA disposed adjacent to a first longer side (the lower side in FIG. 1) of the display device 10 and a second non-display area NDA adjacent to a second longer side (the upper side in FIG. 1) of the display device 10. An external device EXD may be mounted on a pad electrode of the pad area. Examples of the external devices EXD may include a connection film, a printed circuit board, a driver chip DIC, a connector, a line connection film, etc. A scan driver SDR formed on (e.g., directly on) the display substrate of the display device 10 may be disposed in the third non-display area NDA disposed adjacent to a first shorter side of the display device 10 (the left side in FIG. 1).

Figure 2:
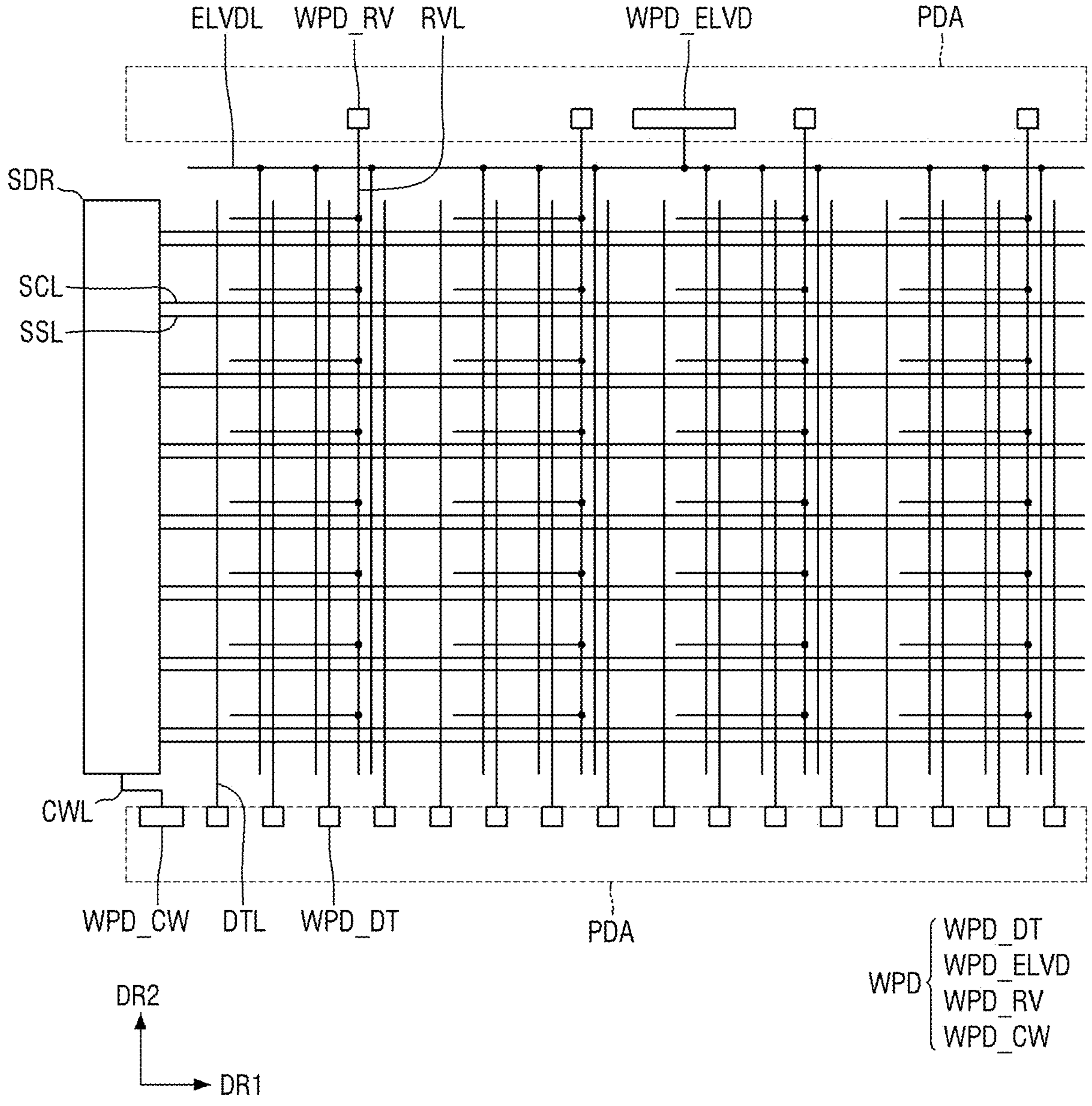
FIG. 2 is a view showing a layout of a circuitry of a display device according to an embodiment.

FIG. 2 is a view showing a layout of a circuitry of a display device according to an embodiment.

Referring to FIG. 2, a plurality of lines is disposed on the substrate. The plurality of lines may include a scan line SCL, a sensing signal line SSL, a data line DTL, a reference voltage line RVL, a first supply voltage line ELVDL, etc.

The scan line SCL and the sensing signal line SSL may be extended in a first direction DR1. The scan line SCL and the sensing signal line SSL may be connected to the scan driver SDR. The scan driver SDR may include a driving circuit formed of a circuit layer. The scan driver SDR may be disposed in the third non-display area NDA on the substrate, but the present disclosure is not limited thereto. The scan driver SDR may be disposed in a fourth non-display area NDA (e.g., a non-display area adjacent to a second shorter side, such as the right side in FIG. 1) or both (e.g., simultaneously) the third non-display area NDA and the fourth non-display area NDA. The scan driver SDR may be connected to a signal connection line CWL. At least one end of the signal connection line CWL may form a pad WPD_CW on the first non-display area NDA and/or the second non-display area NDA and may be connected to an external device EXD (see FIG. 1).

The data line DTL and the reference voltage line RVL may be extended in a second direction DR2 crossing (e.g., crossing perpendicularly to) the first direction DR1. The first supply voltage line ELVDL may include a portion extending in the second direction DR2. The first supply voltage line ELVDL may further include a portion extending in the first direction DR1. The first supply voltage line ELVDL may have, but is not limited to, a mesh structure.

The wire pads WPD may be disposed at least one end of the data line DTL, the reference voltage line RVL, and the first supply voltage line ELVDL. The wire pads WPD may be disposed in the pad area PDA of the non-display area NDA. According to an embodiment of the present disclosure, a wire pad WPD_DT of the data line DTL (hereinafter, referred to as a data pad) may be disposed in the pad area PDA of the non-display area NDA. A wire pad WPD_RV of the reference voltage line RVL (hereinafter referred to as a reference voltage pad) and a wire pad WPD_ELVD of the first supply voltage line ELVDL (hereinafter referred to as a first supply voltage pad) may be disposed in the pad area PDA of the second non-display area NDA. As another example, the data pad WPD_DT, the reference voltage pad WPD_RV and the first supply voltage pad WPD_ELVD may all be disposed in substantially the same area, e.g., the first non-display area NDA. As described above, the external devices EXD (see FIG. 1) may be mounted on the wire pad WPD. The external devices EXD may be mounted on the wire pads WPD by an anisotropic conductive film, ultrasonic bonding, etc.

Each of the pixels PX on the substrate includes a pixel driving circuit. The above-described lines may pass through each of the pixels PX or the periphery thereof to apply a driving signal to the pixel driving circuit. The pixel driving circuit may include a transistor and a capacitor. The numbers of transistors and capacitors of each pixel driving circuit may be changed in a variety of ways. In the following description, the pixel driving circuit having a 3T1C structure including three transistors and one capacitor will be described as an example. It is, however, to be understood that the present disclosure is not limited thereto. A variety of modified pixel structure may be employed such as a 2T1C structure, a 7T1C structure and a 6T1C structure.

Figure 3:
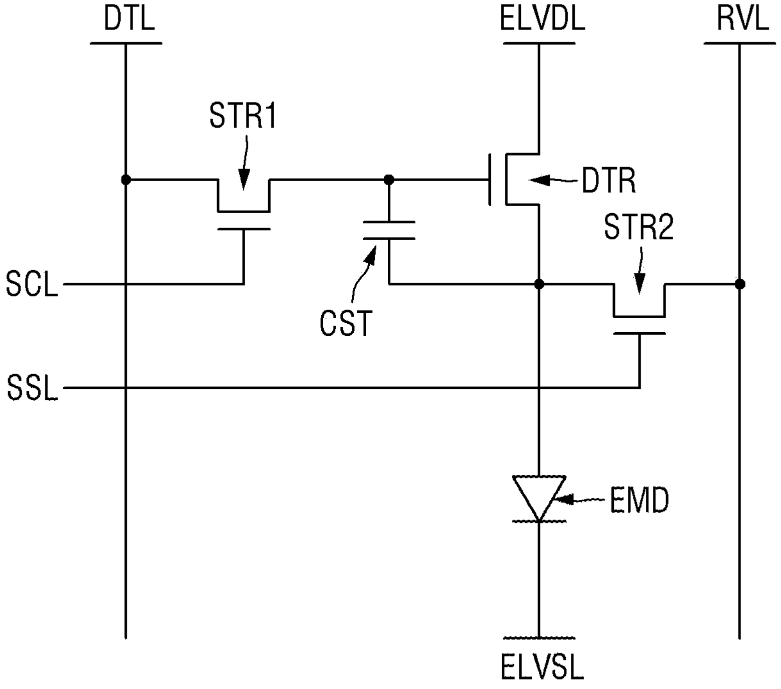
FIG. 3 is an equivalent circuit diagram of a pixel of a display device according to an embodiment of the present disclosure.

FIG. 3 is an equivalent circuit diagram of a pixel of a display device according to an embodiment of the present disclosure.

Referring to FIG. 3, each of the pixels PX of the display device according to the embodiment includes three transistors DTR, STR1 and STR2 and one storage capacitor CST in addition to a light-emitting element EMD.

The light-emitting element EMD emits light proportional to the current supplied through the driving transistor DTR. The light-emitting element EMD may be implemented as an organic light-emitting element, a micro light-emitting element, a nano light-emitting element, etc.

The first electrode (i.e., the anode electrode) of the light-emitting element EMD may be connected to the source electrode of the driving transistor DTR, and the second electrode (i.e., the cathode electrode) thereof may be connected to a second supply voltage line ELVSL, from which a low-level voltage (second supply voltage) is applied, lower than a high-level voltage (first supply voltage) of a first supply voltage line ELVDL.

The driving transistor DTR adjusts a current flowing from the first supply voltage line ELVDL from which the first supply voltage is applied to the light-emitting element EMD according to the voltage difference between the gate electrode and the source electrode. The gate electrode of the driving transistor DTR may be connected to a source/drain electrode of the first switching transistor STR1, the source electrode of the driving transistor DTR may be connected to a first electrode of the light-emitting element EMD, and the drain electrode of the driving transistor DTR may be connected to the first supply voltage line ELVDL from which the first supply voltage is applied.

The first switching transistor STR1 is turned on by a scan signal of a scan line SCL to connect a data line DTL with the gate electrode of the driving transistor DTR. A gate electrode of the first switching transistor STR1 may be connected to the scan line SCL, a first source/drain electrode of the first switching transistor STR1 may be connected to the gate electrode of the driving transistor DTR, and a second source/drain electrode of the first switching transistor STR1 may be connected to the data line DTL.

The second switching transistor STR2 may be turned on by a sensing signal of a sensing signal line SSL to connect a reference voltage line RVL to the source electrode of the driving transistor DTR. A gate electrode of the second switching transistor STR2 may be connected to the sensing signal line SSL, a first source/drain electrode of the second switching transistor STR2 may be connected to the reference voltage line RVL, and a second source/drain electrode of the second switching transistor STR2 may be connected to the source electrode of the driving transistor DTR.

According to an embodiment of the present disclosure, the first source/drain electrode of each of the first and second switching transistors STR1 and STR2 may be a source electrode while the second source/drain electrode thereof may be a drain electrode. It is, however, to be understood that the present disclosure is not limited thereto. For example, the first source/drain electrode of each of the first and second switching transistors STR1 and STR2 may be a drain electrode while the second source/drain electrode thereof may be a source electrode.

The capacitor CST may be formed between the gate electrode and the source electrode of the driving transistor DTR. The storage capacitor CST is to store a voltage difference between the gate voltage and the source voltage of the driving transistor DTR.

The driving transistor DTR and the first and second switching transistors STR1 and STR2 may be formed as thin-film transistors. In some embodiments, although FIG. 3 shows that each of the driving transistor DTR and the first and second switching transistors STR1 and STR2 is implemented as an n-type or -kind MOSFET (metal oxide semiconductor field effect transistor), it is to be noted that the present disclosure is not limited thereto. For example, the driving transistor DTR and the first and second switching transistors STR1 and STR2 may be implemented as p-type or -kind MOSFETs, or one or more of them may be implemented as n-type or -kind MOSFETs while the other(s) may be implemented as p-type or -kind MOSFETs.

Figure 4:
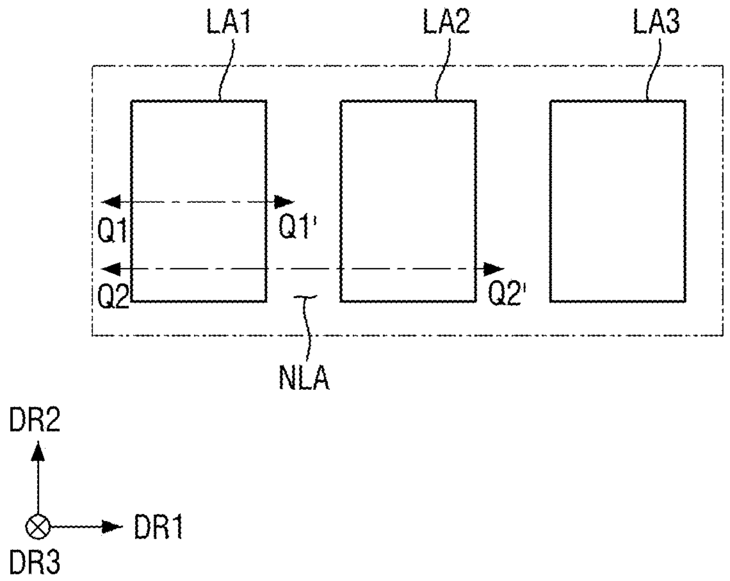
FIG. 4 is a plan view showing a pixel of an organic light-emitting display device according to an embodiment of the present disclosure.
Figure 5:
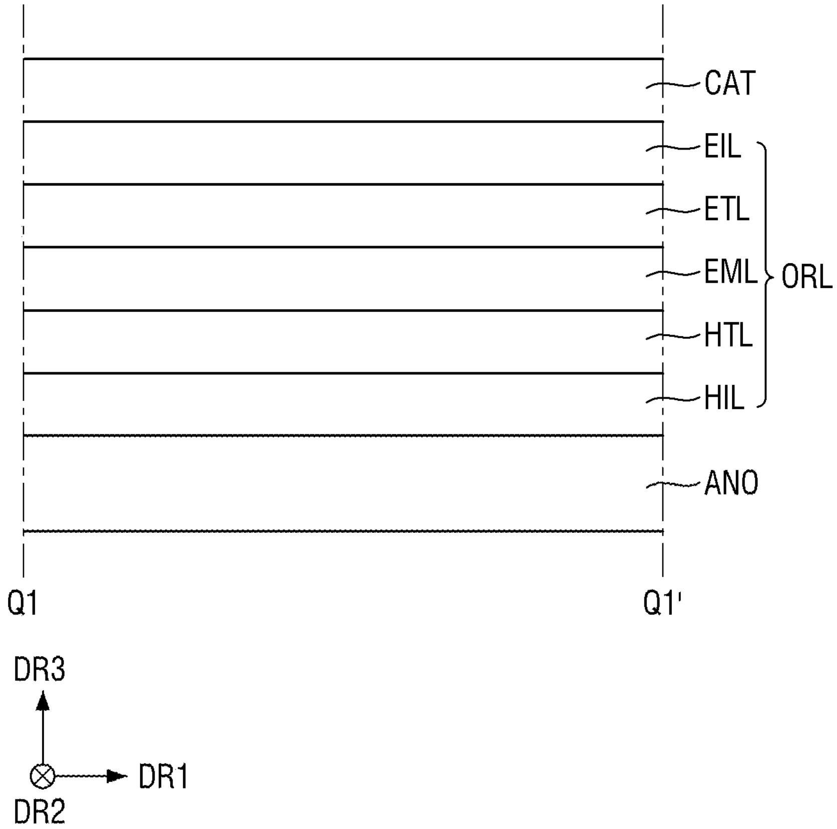
FIG. 5 is a cross-sectional view taken along line Q1-Q1' of FIG. 4.

FIG. 4 is a plan view showing a pixel of an organic light-emitting display device according to an embodiment of the present disclosure. FIG. 5 is a cross-sectional view taken along line Q1-Q1' of FIG. 4.

Referring to FIG. 4, a plurality of emission areas LA1, LA2 and LA3 and a non-emission area NLA may be defined on the substrate in the display area DPA. In some embodiments, a plurality of emission areas LA1, LA2 and LA3 in the display area DPA may include a first emission area LA1, a second emission area LA2 and a third emission area LA3. In the first, second and third emission areas LA1, LA2 and LA3, lights generated in the light-emitting elements of the substrate exit to the outside. In the non-emission area NLA, light may be blocked from exiting to the outside. For example, in the non-emission area NLA, no lights exit to the outside in some embodiments.

In some embodiments, different lights may exit out of the first emission area LA1, the second emission area LA2 and the third emission area LA3. For example, the first emission area LA1 may be to emit light of a first color, the second emission area LA2 may be to emit light of a second color, and the third emission area LA3 may be to emit light of a third color. The light of the first color may be blue light having a peak wavelength in the range of approximately (about) 440 to (about) 480 nm. The light of the second color may be red light having a peak wavelength in the range of approximately (about) 610 to (about) 650 nm. The light of the third color may be green light having a peak wavelength in the range of approximately (about) 510 to (about) 550 nm. It should be understood, however, that the present disclosure is not limited thereto. For example, the light of the second color may be green light and the light of the third color may be red light.

In some embodiments, the first emission area LA1, the second emission area LA2 and the third emission area LA3 may form a single group, and a plurality of such groups may be defined in the display area DPA.

In some embodiments, as shown in FIG. 4, the first emission area LA1, the second emission area LA2 and the third emission area LA3 may be arranged sequentially in a direction. In some embodiments, the first emission area LA1, the second emission area LA2 and the third emission area LA3 may form a single group, and such groups may be repeatedly arranged in the display area DPA.

It is, however, to be understood that the present disclosure is not limited thereto. The arrangement of the first emission area LA1, the second emission area LA2 and the third emission area LA3 may be altered in a variety of suitable ways.

Referring to FIG. 5, an anode electrode ANO, an organic layer ORL and a cathode electrode CAT may be disposed in the first emission area LA1. Although only the first emission area LA1 is described in more detail in FIG. 5 as an example, it is to be understood that the description may be equally or similarly applied to the second and third emission areas LA2 and LA3.

The anode electrode ANO may be a reflective electrode. The anode electrode ANO may include a reflective layer and a metal oxide layer stacked on the reflective layer. According to an embodiment of the present disclosure, the anode electrode ANO may have a two-layer structure of ITO/Ag, Ag/ITO, ITO/Mg or ITO/$MgF_2$, or a three-layer structure of ITO/Ag/ITO.

The organic layer ORL may include a plurality of functional layers. For example, the organic layer ORL may include a hole injection layer HIL, a hole transport layer HTL, an emission material layer EML, an electron transport layer ETL, and an electron injection layer EIL.

The hole injection layer HIL may be disposed on (e.g., directly on) the anode electrode ANO. The hole injection layer HIL may facilitate injection of holes into the emission material layer EML. In some embodiments, the hole injection layer HIL may be made of, but is not limited to, at least one selected from the group consisting of: Cu Pc (copper phthalocyanine), PEDOT (poly(3,4)-ethylenedioxythiophene), PANI (polyaniline) and NPD (N,N-dinaphthyl-N, N'-diphenyl benzidine).

The hole transport layer HTL may be disposed on the hole injection layer HIL. The hole transport layer HTL may facilitate the transport of holes and may include a hole transport material. The hole transport material may include, but is not limited to, carbazole derivatives such as N-phenylcarbazole and/or polyvinylcarbazole, fluorene derivatives, triphenylamine derivatives such as TPD(N,N'-bis(3-methylphenyl)-N,N'-diphenyl-[1,1-biphenyl]-4,4'-diamine) and/or TCTA(4,4',4"-tris(N-carbazolyl)triphenylamine), NPB(N,N'-di(1-naphthyl)-N,N'-diphenylbenzidine), TAPC (4,4'-Cyclohexylidene bis[N,N-bis(4-methylphenyl)benzenamine]), etc.

The emission material layer EML may be disposed on the hole transport layer HTL. The emission material layers EML in the emission areas LA1, LA2 and LA3 may be to emit the lights of different colors. For example, the emission material layer EML of the first emission area LA1 may be to emit light of a first color, for example, blue light. The emission material layer EML of the second emission area LA2 may be to emit light of a second color, for example, red light. The emission material layer EML of the third emission area LA3 may be to emit light of a third color, for example, green light.

In some embodiments, the emission material layer EML for emitting blue light may include a host and a dopant. The material of the host is not particularly limited herein and may, for example, be a host material that is generally available. In some embodiments, the material of the host may include Alq3(tris(8-hydroxyquinolino)aluminum), CBP(4,4'-bis(N-carbazolyl)-1,1'-biphenyl), PVK(poly(n-vinylcarbazole)), ADN(9,10-di(naphthalene-2-yl)anthracene), TCTA(4,4',4"-Tris(carbazol-9-yl)-triphenylamine), TPBi(1,3,5-tris(N-phenylbenzimidazole-2-yl)benzene), TBADN(3-tert-butyl-9,10-di(naphth-2-yl)anthracene), DSA(distyrylarylene), CDBP(4,4'-bis(9-carbazolyl)-2,2"-dimethyl-biphenyl), MADN(2-Methyl-9,10-bis(naphthalen-2-yl) anthracene), etc.

In some embodiments, the emission material layer EML that is to emit blue light may include a fluorescent material including one selected from the group consisting of: spiro-DPVBi, spiro-6P, DSB(distyryl-benzene), DSA(distyryl-arylene), PFO(polyfluorene) polymer and PPV (poly(p-phenylene vinylene) polymer. As another example, the emission material layer EML may include a phosphorescent material including an organometallic complex such as (4,6-F2ppy) 2Irpic.

In some embodiments, the emission material layer EML that is to emit red light may include, for example, a host material such as CBP (carbazole biphenyl) or mCP(1,3-bis (carbazol-9-yl), and may be made of a phosphorescent material including a dopant including one or more selected from the group consisting of: PIQIr(acac)(bis(1-phenylisoquinoline)acetylacetonate iridium), PQIr(acac)(bis(1-phenylquinoline)acetylacetonate iridium), PQIr(tris(1-phenylquinoline)iridium) and PtOEP(octaethylporphyrin platinum). In some embodiments, it may be made of, but is not limited to, a fluorescent material including PBD:Eu (DBM)3(Phen) and/or perylene.

In some embodiments, the emission material layer EML that is to emit green light may include a host material including CBP and/or mCP, may be made of a phosphor containing a dopant material including Ir(ppy)3(fac-tris(2-phenylpyridine)iridium). In some embodiments, it may be made of, but is not limited to, a fluorescent material including Alq3(tris(8-hydroxyquinolino)aluminum).

It is, however, to be understood that the present disclosure is not limited thereto. The emission material layer EML of each of the emission areas LA1, LA2 and LA3 may be to emit the light of the same color. For example, the emission material layer EML may be to emit blue light of the first color or white light of a fourth color.

The electron transport layer ETL may be disposed on the emission material layer EML. The electron transport layer ETL may include electron transparent material such as Alq3(Tris(8-hydroxyquinolinato)aluminum), TPBi(1,3,5-Tri(1-phenyl-1H-benzo[d]imidazol-2-yl)phenyl), BCP(2,9-Dimethyl-4,7-diphenyl-1,10-phenanthroline), Bphen(4,7-Diphenyl-1,10-phenanthroline), TAZ(3-(4-Biphenylyl)-4-phenyl-5-tert-butylphenyl-1,2,4-triazole), NTAZ(4-(Naphthalen-1-yl)-3,5-diphenyl-4H-1,2,4-triazole), tBu-PBD(2-(4-Biphenylyl)-5-(4-tert-butylphenyl)-1,3,4-oxadiazole), BAlq(Bis(2-methyl-8-quinolinolato-N1,O8)-(1,1'-Biphenyl-4-olato)aluminum), Bebq2(berylliumbis (benzoquinolin-10-olate), ADN(9,10-di(naphthalene-2-yl) anthracene) and/or a mixture thereof. It is to be noted that the type or kind of the electron transport material is not particularly limited herein.

The electron injection layer EIL may be disposed on the electron transport layer ETL. The electron injection layer EIL facilitates the injection of electrons and may be made of, but is not limited to, Alq3(tris(8-hydroxyquinolino)aluminum), PBD, TAZ, spiro-PBD, BAlq and/or SAlq. In some embodiments, the electron injection layer EIL may be a metal halide compound and may be, but is not limited to, at least one selected from the group consisting of: $MgF_2$, LiF, NaF, KF, RbF, CsF, FrF, LiI, NaI, KI, RbI, CsI, FrI and/or $CaF_2$. In some embodiments, the electron injection layer EIL may include a lanthanide-series material such as Yb, Sm and/or Eu. In some embodiments, the electron injection layer EIL may include a metal halide material as well as a lanthanide material such as RbI:Yb and/or KI:Yb. When the electron injection layer EIL includes both (e.g., simultaneously) a metal halide material and a lanthanide material, the electron injection layer EIL may be formed by co-deposition of the metal halide material and the lanthanide material.

The cathode electrode CAT may be disposed on the organic layer ORL. The cathode electrode CAT may have transparency. When the cathode electrode CAT has transparency, it may include silver (Ag), magnesium (Mg), copper (Cu), aluminum (Al), platinum (Pt), palladium (Pd), gold (Au), nickel (Ni), neodymium (Nd), iridium (Ir), chromium (Cr), lithium (Li), calcium (Ca), LiF/Ca, LiF/AI, molybdenum (Mo), titanium (Ti), or a compound or a mixture thereof, e.g., a mixture of Ag and Mg. In some embodiments, when the thickness of the cathode electrode CAT ranges from several tens to several hundred angstroms, the cathode electrode CAT may be semi-transparent. In some embodiments, the cathode electrode CAT may include a transparent conductive oxide (TCO). For example, the cathode electrode CAT may be formed of tungsten oxide (WxOy), titanium oxide ($TiO_2$), indium tin oxide (ITO), indium zinc oxide (IZO), zinc oxide (ZnO), indium tin zinc oxide, magnesium oxide (MgO), etc.

Figure 6:
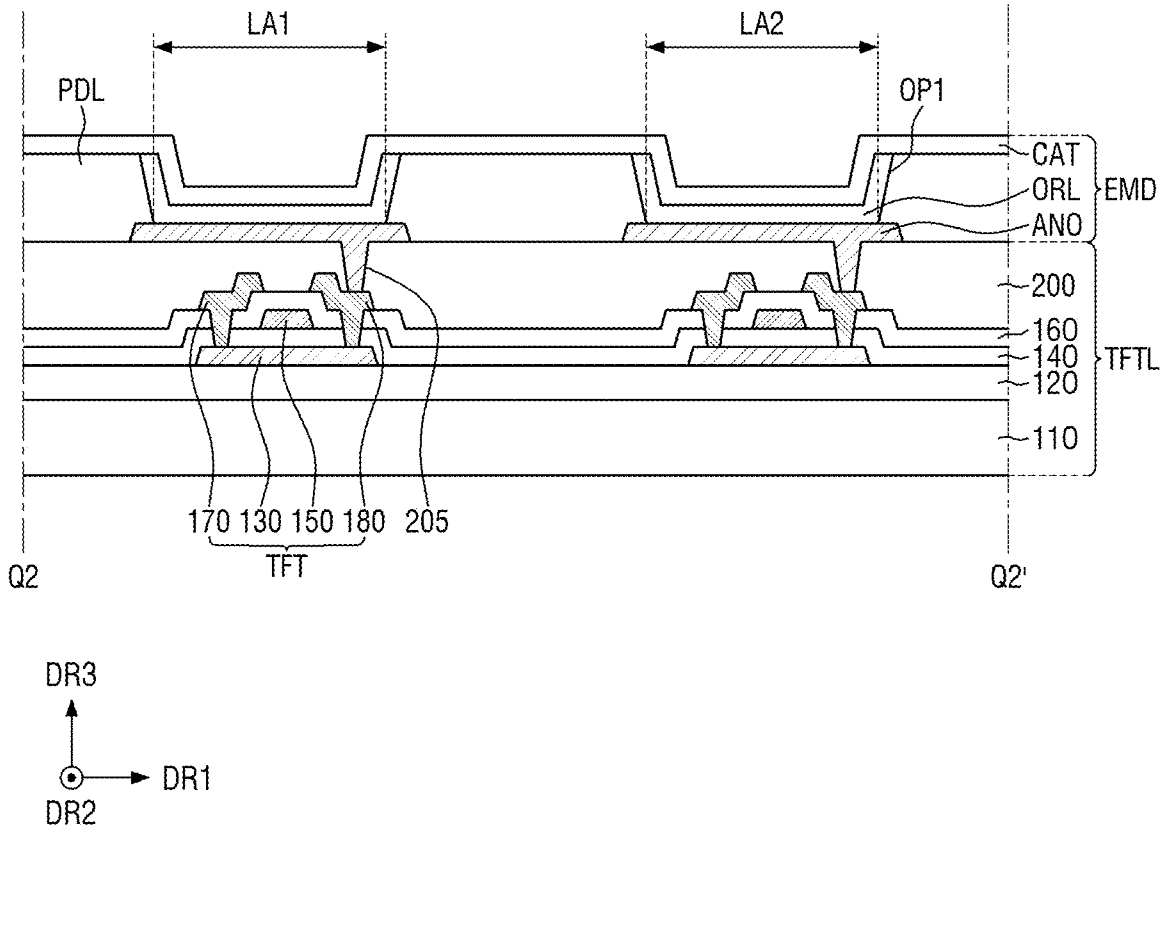
FIG. 6 is a cross-sectional view taken along line Q2-Q2' of FIG. 4.
Figure 7:
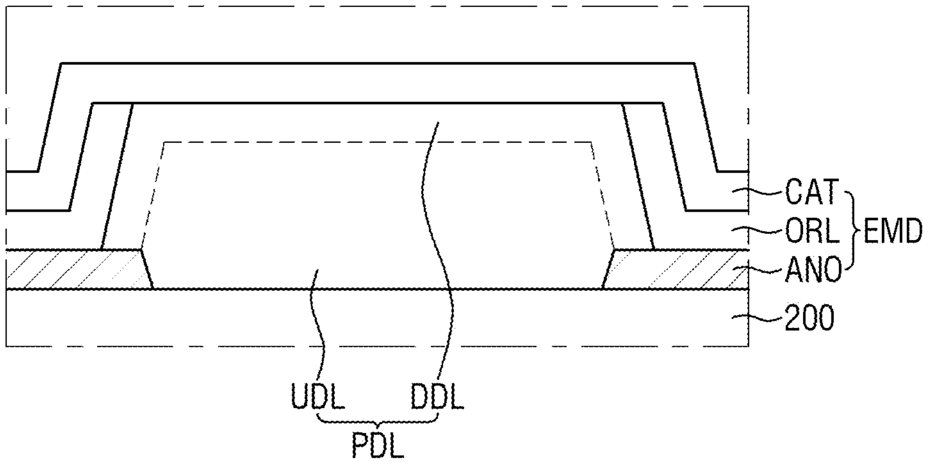
FIG. 7 is an enlarged view showing a portion of FIG. 4.
Figure 8:
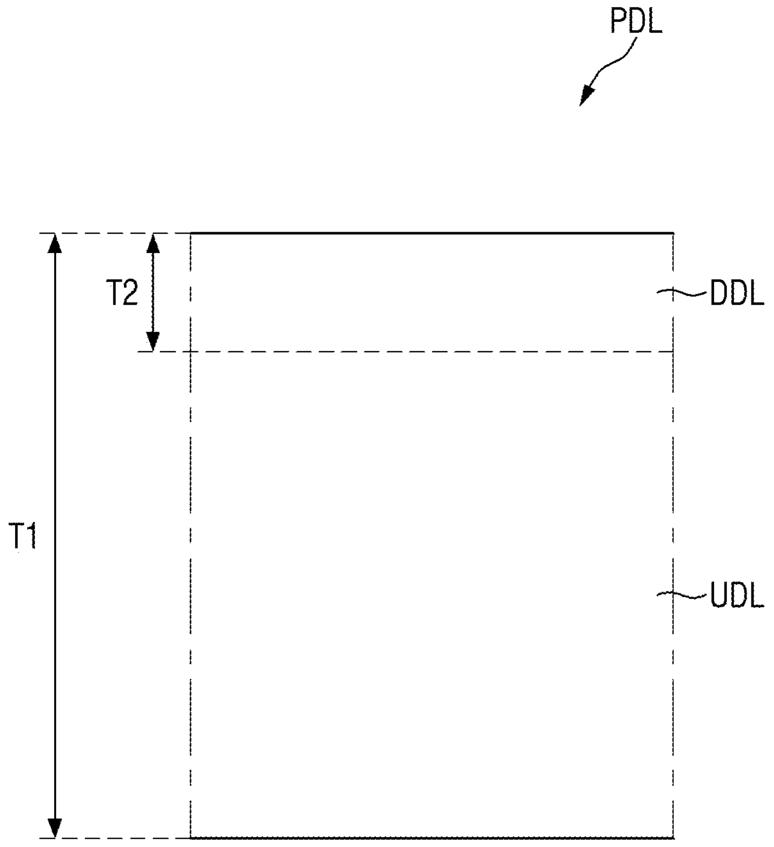
FIG. 8 is a view schematically showing a pixel-defining film according to an embodiment of the present disclosure.
Figure 9:
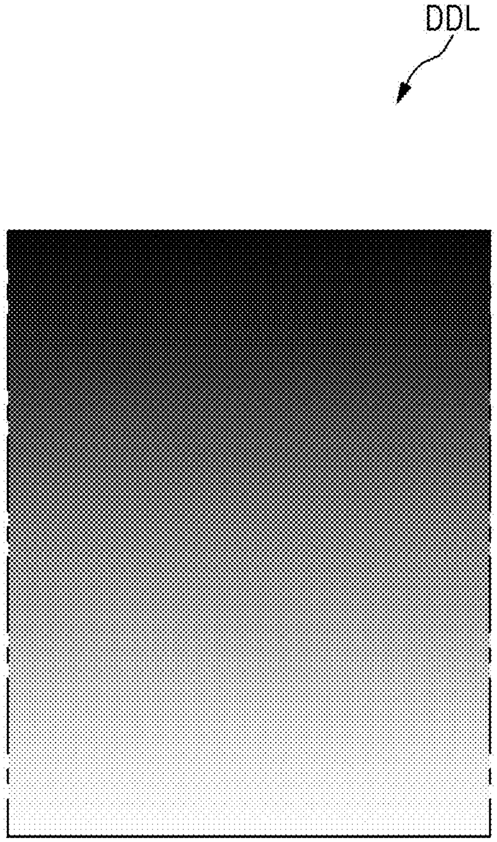
FIG. 9 is an enlarged view schematically showing a first region of a pixel-defining film according to an embodiment of the present disclosure.

FIG. 6 is a cross-sectional view taken along line Q2-Q2' of FIG. 4. FIG. 7 is an enlarged view showing a portion of FIG. 4. FIG. 8 is a view schematically showing a pixel-defining film according to an embodiment of the present disclosure. FIG. 9 is an enlarged view schematically showing a first region of a pixel-defining film according to an embodiment of the present disclosure.

Referring to FIG. 6, a display device 10 according to an embodiment may include a transistor layer TFTL disposed on a substrate 110, and may include light-emitting elements EMD each including an anode electrode ANO, an organic layer ORL, and a cathode electrode CAT. In some embodiments, the display device 10 according to the embodiment may include a pixel-defining film PDL disposed on the transistor layer TFTL to define each of the emission areas LA1 and LA2.

For example, the substrate 110 may be a rigid substrate or a flexible substrate that can be bent, folded, rolled, and so on. The substrate 110 may be made of an insulating material such as glass, quartz and/or a polymer resin. The examples of the polymer material may be polyethersulphone (PES), polyacrylate (PA), polyetherimide (PEI), polyethylenenaphthalate (PEN), polyethyleneterephthalate (PET), polyphenylenesulfide (PPS), polyallylate, polyimide (PI), polycarbonate (PC), cellulosetriacetate (CAT), cellulose acetate propionate (CAP), or combinations thereof. The substrate 110 may include a metal material.

The transistor layer TFTL may be disposed on the substrate 110. The transistor layer TFTL may include a transistor TFT, a buffer layer 120, a gate insulator 140, an interlayer dielectric layer 160, and a via layer 200.

The buffer layer 120 may be disposed on the substrate 110. The buffer layer 120 may be disposed on the substrate 110 to protect the transistor TFT and the light-emitting element EMD from moisture permeating through the substrate 110 that is susceptible to moisture permeation. The buffer layer 120 may be made up of a single layer, or a plurality of inorganic films stacked on one another alternately. For example, the buffer layer 120 may include silicon oxide ($SiO_2$), silicon nitride (SiN) and/or silicon oxynitride (SiON), and may be a multilayer in which inorganic films thereof are alternately stacked on one another. It is, however, to be noted that the buffer layer 120 may be eliminated (e.g., not included) in some embodiments.

A transistor TFT may be disposed on the buffer layer 120. The transistor TFT may include an active layer 130, a gate electrode 150, a source electrode 170, and a drain electrode 180. In FIG. 6, the transistor TFT is implemented as a top-gate transistor in which the gate electrode 150 is located above the active layer 130. It is, however, to be understood that the present disclosure is not limited thereto. That is to say, the transistor TFT may be implemented as a bottom-gate transistor in which the gate electrode is located below the active layer, or as a double-gate transistor in which the gate electrodes are disposed above and below the active layer, respectively.

The active layer 130 may be disposed on the buffer layer 120. The active layer 130 may include polycrystalline silicon, monocrystalline silicon, an oxide semiconductor, etc. When the active layer 130 includes an oxide semiconductor, the active layer 130 may include a plurality of conductive regions and a channel region therebetween. The oxide semiconductor may be an oxide semiconductor containing indium (In). For example, the oxide semiconductor may be indium-tin oxide (ITO), indium-zinc oxide (IZO), indium-gallium oxide (IGO), indium-zinc-tin oxide (IZTO), indium-gallium-tin oxide (IGTO), indium-gallium-zinc-tin oxide (IGZTO), etc.

In another embodiment, the active layer 130 may include polycrystalline silicon. The polycrystalline silicon may be formed by crystallizing amorphous silicon, and in such case, the conductive regions of the active layer 130 may be doped regions doped with impurities.

A light-blocking layer for blocking external light incident on the active layer 130 may be further disposed between the buffer layer 120 and the active layer 130. When the light-blocking layer is disposed, the light-blocking layer may overlap with the active layer 130 and may be made of an opaque metal material that blocks transmission of light.

The gate insulator 140 may be formed on the active layer 130. The gate insulator 140 may be disposed on the buffer layer 120, including the active layer 130. The gate insulator 140 may be made up of an inorganic layer including an inorganic film, such as silicon oxide ($SiO_2$), silicon nitride (SiN) and silicon oxynitride (SiON), or a stack of such materials.

The gate electrode 150 may be disposed on the gate insulator 140. A gate line and one electrode of the storage capacitor may be further disposed on the same layer as the gate electrode 150. The gate electrode 150 may be disposed to overlap with the active layer 130 in a thickness direction. The gate electrode 150 may be made up of a single layer or multiple layers of molybdenum (Mo), aluminum (Al), chromium (Cr), gold (Au), titanium (Ti), nickel (Ni), neodymium (Nd) and copper (Cu) and/or an alloy thereof. It is, however, to be understood that the present disclosure is not limited thereto.

The interlayer dielectric layer 160 may be disposed on the gate electrode 150. The interlayer dielectric layer 160 may work as an insulating film between the gate electrode 150 and other layers disposed thereon. In some embodiments, the interlayer dielectric layer 160 may be disposed such that it covers the gate electrode 150 to protect it. The interlayer dielectric layer 160 may be made up of an inorganic layer including an inorganic material, such as silicon oxide ($SiO_2$), silicon nitride (SiN) and silicon oxynitride (SiON), or a stack of such materials.

The source electrode 170 and the drain electrode 180 may be disposed on the interlayer dielectric layer 160. Each of the source electrode 170 and the drain electrode 180 may be connected to the active layer 130 through contact holes penetrating through the gate insulator 140 and the interlayer dielectric layer 160.

The source electrode 170 and the drain electrode 180 may be made up of a single layer or multiple layers of molybdenum (Mo), aluminum (Al), chromium (Cr), gold (Au), titanium (Ti), nickel (Ni), neodymium (Nd), copper (Cu) and/or an alloy thereof. It is, however, to be understood that the present disclosure is not limited thereto. Accordingly, the transistor TFT including the active layer 130, the gate electrode 150, the source electrode 170 and the drain electrode 180 may be disposed.

The via layer 200 may be disposed on the source electrode 170 and the drain electrode 180 to provide a flat surface over the transistor TFT. The via layer 200 may include a via hole 205 through which the anode electrode ANO is connected to the transistor TFT. The anode electrode ANO may be connected to the drain electrode 180 of the transistor TFT through the via hole 205.

The via layer 200 may include an organic material such as an acryl resin, an epoxy resin, a phenolic resin, a polyamide resin and/or a polyimide resin, to provide the flat surface. It is, however, to be understood that the present disclosure is not limited thereto.

A pixel-defining film PDL and light-emitting elements EMD may be disposed on the via layer 200. Each of the light-emitting elements EMD may include the anode electrode ANO, the organic layer ORL, and the cathode electrode CAT.

The anode electrode ANO may be (e.g., may work as) a pixel electrode and may be connected to the drain electrode 180 of the transistor TFT through the via hole 205. The anode electrode ANO has been described above and thus redundant descriptions may not be repeated.

The pixel-defining film PDL may be disposed on the via layer 200 to cover the edge of the anode electrode ANO to define each of the emission areas. The pixel-defining film PDL may include an opening OP1 exposing the anode electrode ANO to define pixels, e.g., emission areas. The pixel-defining film PDL may include an organic material such as an acryl resin, an epoxy resin, a phenolic resin, a polyamide resin, a polyimide resin and/or a novolak resin, to provide a flat surface.

The organic layer ORL may be disposed on the anode electrode ANO and the pixel-defining layer PDL. As described above, the organic layer ORL may include at least one of the hole injection layer HIL (see FIG. 5), the hole transport layer HTL (see FIG. 5), the emission material layer EML (see FIG. 5), the electron transport layer ETL (see FIG. 5), or the electron injection layer EIL (see FIG. 5).

The cathode electrode CAT may be disposed on the organic layer ORL. The cathode electrode CAT has been described above and thus redundant descriptions may not be repeated.

Referring to FIGS. 7 to 9, the pixel-defining layer PDL according to the embodiment may include a first region DDL and a second region UDL. The first region DDL may be doped with ions, whereas the second region UDL may be the other region than the ion-doped region, i.e., the first region DDL. In some embodiments, the second region UDL is not doped with ions. The first region DDL may include the top surface of the pixel-defining film PDL and the inner circumferential surface of the opening OP1 of the pixel-defining film PDL. For example, the first region DDL may include a portion (e.g., a sidewall) of the pixel-defining film PDL that defines at least part (e.g., part or all) of the opening OP1 of the pixel-defining film PDL and a top portion (e.g., a top layer) of the pixel-defining film PDL (e.g., a portion of the pixel-defining film PDL opposite to the via layer 200 and/or to the substrate 110).

The first region DDL may maintain the surface of the pixel-defining layer PDL. The first region DDL may have a set or predetermined thickness from the surface of the pixel-defining film PDL to the inside. The first region DDL may be disposed adjacent to the cathode electrode CAT.

The first region DDL may be doped with ions and thus may exhibit a black color. When the pixel-defining film PDL is doped with ions, cross-linking of polymers forming the pixel-defining film PDL and carbonization are activated as the dose of the ions increases. For example, the cross-linking may bind molecules of the polymer by the doped ions. Carbonization is to generate carbide (e.g., carbide) of doped ions. For example, boron carbide may be generated when boron is doped. In particular, boron carbide formed by carbonization may exhibit black color and may be to absorb external light. According to the embodiment of the present disclosure, it is possible to prevent or reduce reflection of external light by doping the pixel-defining film PDL with ions to form the first region DDL exhibiting black color so that external light is absorbed. For example, the pixel-defining layer PDL (e.g., the first region DDL of the pixel-defining film PDL) can absorb more external light, and reflect less external light, when the first region DDL is doped with ions compared to when the pixel-defining layer PDL is not doped with ions.

The first region DDL may include ions doped into the first region DDL. The ions may be boron. Boron may be doped into the pixel-defining film PDL with a set or predetermined dose. For example, the doping dose of boron may range from 5 $E15/cm^2$ to 1 $E16/cm^2$. In order for the first region DDL of the pixel-defining film PDL that exhibits black color to be easily formed, it is desired or suitable that the doping dose of boron is 5 $E15/cm^2$ or more. In order to reduce the ion doping process time, it is desired or suitable that the doping dose of boron is 1 $E16/cm^2$ or less.

The thickness T2 of the first region DDL may be in a range of 0.005% to 0.025% of the thickness T1 of the pixel-defining film PDL. In some embodiments, the thickness T2 of the first region DDL may be a thickness from an interface between the first region DDL and the second region UDL and an outer surface of the first region DDL along a direction coincident with a shortest straight line between the interface and the outer surface of the first region DDL. In some embodiments, the thickness T2 of the first region DDL may be a thickness from the top surface of the first region DDL facing away from the via layer 200 and/or the substrate 110 to the interface between the first region DDL and the second region UDL along a thickness direction (e.g., DR3) of the via layer 200 and/or of the substrate 110. In some examples, the thickness T1 of the pixel-defining film PDL may be a thickness from a lower surface of the pixel-defining film PDL facing the via layer 200 and/or the substrate 100 (e.g., a surface of the pixel-defining film PDL in direct contact with the via layer 200) and a top surface of the pixel-defining film PDL opposite to the lower surface of the pixel-defining film PDL along the thickness direction (e.g., DR3) of the via layer 200 and/or of the substrate 100. When the thickness T2 of the first region DDL is equal to or greater than 0.005% of the thickness T1 of the pixel-defining film PDL, the surface of the pixel-defining film PDL exhibits black and accordingly absorption of external light can be improved. When the thickness T2 of the first region DDL is equal to or less than 0.025% of the thickness T1 of the pixel-defining film PDL, the ion doping process time can be reduced. According to an embodiment, the thickness of the pixel-defining film PDL may be approximately 2 μm, and the thickness T2 of the first region DDL may be in the range of 10 nm to 50 nm. It is to be understood that the thicknesses of the pixel-defining film PDL and the first region DDL are not limited thereto.

As shown in FIG. 9, the doped ions may form a concentration gradient that decreases downward in the first region DDL. For example, the first region DDL may form a concentration gradient in which the concentration of ions decreases from the surface of the pixel-defining film PDL to the second region UDL. Because the ion doping is conducted at the upper portion of the pixel-defining film PDL, the ion concentration may be higher at the upper portion of the first region DDL and the ion concentration may decrease toward the lower portion.

The second region UDL may be the other region than the first region DDL. The second region UDL may be covered by the first region DDL. The second region UDL may be an undoped region in which there is no doped ions. The second region UDL may be disposed adjacent to the anode electrode ANO. The second region UDL may be in contact (e.g., direct contact) with the top surface of the via layer 200 whereas the first region DDL may not be in contact with the top surface of the via layer 200. In some embodiments, the first region DDL may be in direct contact with the organic layer ORL and the cathode electrode CAT whereas the second region UDL may not be in contact with the organic layer ORL or the cathode electrode CAT.

The thickness of the second region UDL may be greater than the thickness T2 of the first region DDL. The thickness of the second region UDL may be similar to the thickness T1 of the pixel-defining film PDL. As described above, because the thickness T2 of the first region DDL is very small (e.g., very or substantially small compared to the thickness T1 of the pixel-defining film PDL), the thickness of the second region UDL may be similar to the thickness T1 of the pixel-defining film PDL.

According to the embodiment of the present disclosure, the pixel-defining film PDL in which the first region DDL and the second region UDL are formed by being doped with ions may exhibit a set or predetermined optical density. For example, the optical density of the pixel-defining film PDL may be in the range of 0.7 to 1.

As described above, in the display device 10 according to the embodiment of the present disclosure, it is possible to prevent or reduce reflection of external light by doping the pixel-defining film PDL with ions to form the first region DDL exhibiting black color so that external light is absorbed. Accordingly, it is possible to prevent or reduce a decrease in color gamut and to improve the issue of leakage current of a transistor due to external light.

Figure 10:
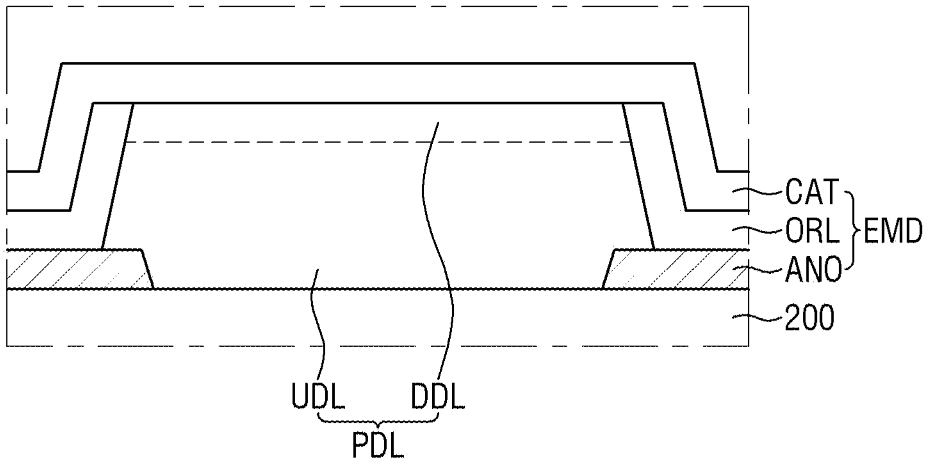
FIG. 10 is a view showing a portion of a display device according to another embodiment of the present disclosure.

FIG. 10 is a view showing a portion of a display device according to another embodiment of the present disclosure. The region shown in FIG. 10 corresponds to that of FIG. 7.

The embodiment of FIG. 10 is different from the embodiment of FIG. 7 in that a first region DDL of a pixel-defining film PDL of a display device 10 is formed at the top surface of the pixel-defining film PDL. In the following description, the description will focus on the difference and the redundant description may not be repeated.

The pixel-defining film PDL may include a first region DDL and a second region UDL other than the first region DDL. The second region UDL may be different from the first region DDL. The first region DDL may form the upper portion of the pixel-defining film PDL, and the second region UDL may form the lower portion of the pixel-defining film PDL. The first region DDL may be disposed on the second region UDL.

The first region DDL may include the top surface of the pixel-defining film PDL that is in contact with the cathode electrode CAT. The first region DDL may be disposed parallel to the top surface of the via layer 200. In some embodiments, the first region DDL may not be in contact with the via layer 200 or the anode electrode ANO.

The second region UDL may be disposed under the first region DDL and may be in contact (e.g., direct contact) with the organic layer ORL, the anode electrode ANO, and the via layer 200. The second region UDL may include at least part of the inner circumferential surface of the opening OP1 of the pixel-defining film PDL.

The pixel-defining film PDL may be formed by applying an organic material layer, doping ions, and then patterning the organic material layer, as will be described later with reference to a method of fabricating the same. Accordingly, the first region DDL may form the upper portion of the pixel-defining film PDL, and the second region UDL may form the lower portion of the pixel-defining film PDL.

Hereinafter, a method of fabricating the above-described display device will be described with reference to other drawings.

FIGS. 11 to 16 are views showing processing steps of a method of fabricating a display device according to an embodiment of the present disclosure. FIGS. 11 to 16 may correspond to the display device of FIG. 6.

Figure 11:
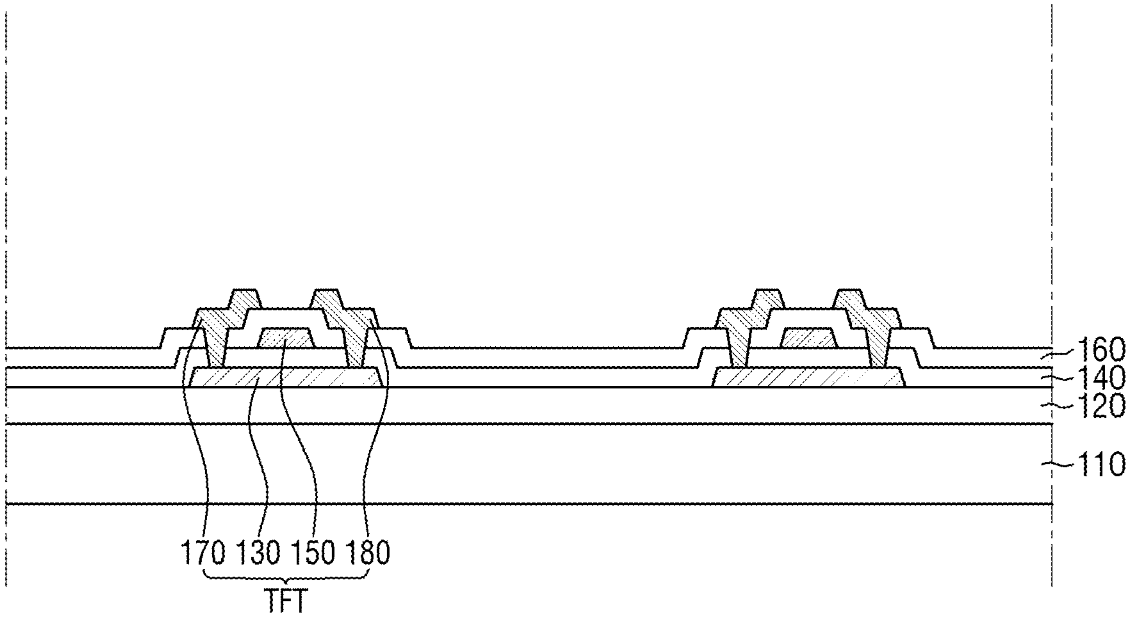
FIGS. 11-16 are views showing processing steps of a method of fabricating a display device according to an embodiment of the present disclosure.

Referring to FIG. 11, a buffer layer 120 is formed on a substrate 110, and an active layer 130 is formed on the buffer layer 120. The active layer 130 may be formed via a mask process. For example, oxide semiconductor or silicon may be deposited entirely on the buffer layer 120 and then patterned via a photolithography process, to form the active layer 130 as shown in FIG. 11.

Subsequently, a gate insulator 140 is formed on the active layer 130, and a gate electrode 150 overlapping the active layer 130 is formed on the gate insulator 140. The gate electrode 150 may be formed via a mask process. For example, a material layer for the gate electrode may be entirely deposited on the gate insulator 140. Subsequently, after applying a photoresist layer on the material layer for the gate electrode, a photoresist pattern is formed by exposure and development, and then the material layer for the gate electrode is etched utilizing it as an etching mask. Subsequently, the photoresist pattern may be removed via a strip and/or ashing process to form the gate electrode 150.

Subsequently, an interlayer dielectric layer 160 is formed on the gate electrode 150, and a source electrode 170 and a drain electrode 180 are formed on the interlayer dielectric layer 160. The source electrode 170 and the drain electrode 180 may be formed via the above-described mask process. Before forming the source electrode 170 and the drain electrode 180, contact holes exposing the active layer 130 may be formed through the interlayer dielectric layer 160 and the gate insulator 140. Subsequently, a source/drain electrode material layer may be deposited entirely on the interlayer dielectric layer 160 and patterned via a photolithography process to form the source electrode 170 and the drain electrode 180. The source electrode 170 and the drain electrode 180 may be connected to the active layer 130 via the contact holes, respectively. Accordingly, the transistor TFT including the active layer 130, the gate electrode 150, the source electrode 170 and the drain electrode 180 may be formed.

Figure 12:
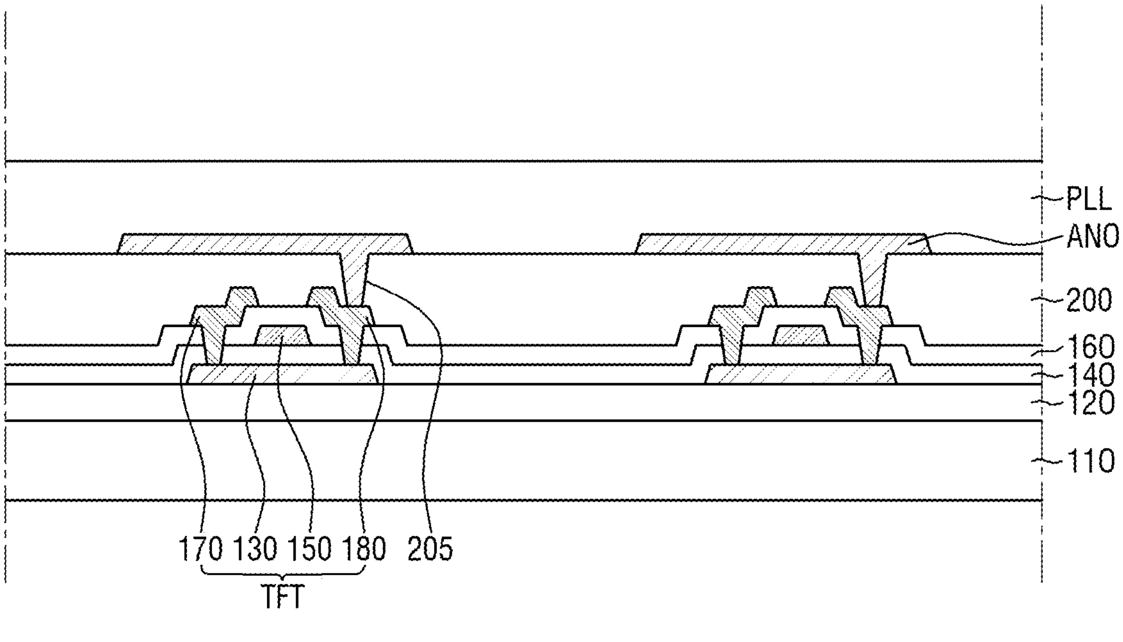

Subsequently, referring to FIG. 12, a via layer 200 may be formed on the source electrode 170 and the drain electrode 180. The via layer 200 may be formed by coating an organic material via a solution process, for example, spin coating. Subsequently, a via hole 205 exposing the drain electrode 180 of the transistor TFT may be formed via a photolithography process.

Subsequently, an anode electrode ANO may be formed on the via layer 200. The anode electrode ANO may be formed via the above-described mask process. For example, an anode electrode material layer may be deposited on the entire surface of the via layer 200 and patterned via a photolithography process to form the anode electrode ANO. The anode electrode ANO may be connected to the drain electrode 180 of the transistor TFT through the via hole 205.

Subsequently, an organic material layer PLL may be applied on the substrate 110. The organic material layer PLL may be formed by applying a solution process, for example, spin coating, inkjet printing, etc.

Figure 13:
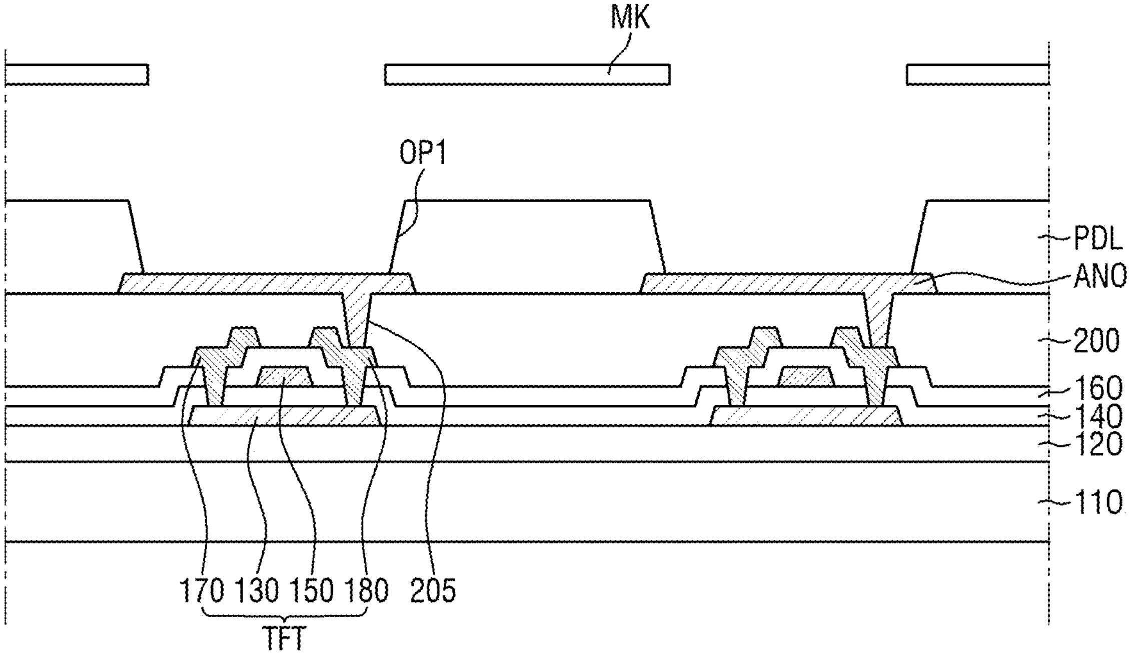

Subsequently, referring to FIG. 13, the organic material layer PLL is patterned to form a pixel-defining film PDL. For example, a mask MK may be aligned above the substrate 110 on which the organic material layer PLL is applied. The mask MK may have an opening formed where the organic material layer PLL is to be removed. UV light may be irradiated from above the mask MK, and then the exposed area is removed, so that the pixel-defining film PDL including the opening OP1 is formed. A portion of the anode electrode ANO may be exposed through the opening OP1 of the pixel-defining film PDL.

Figure 14:
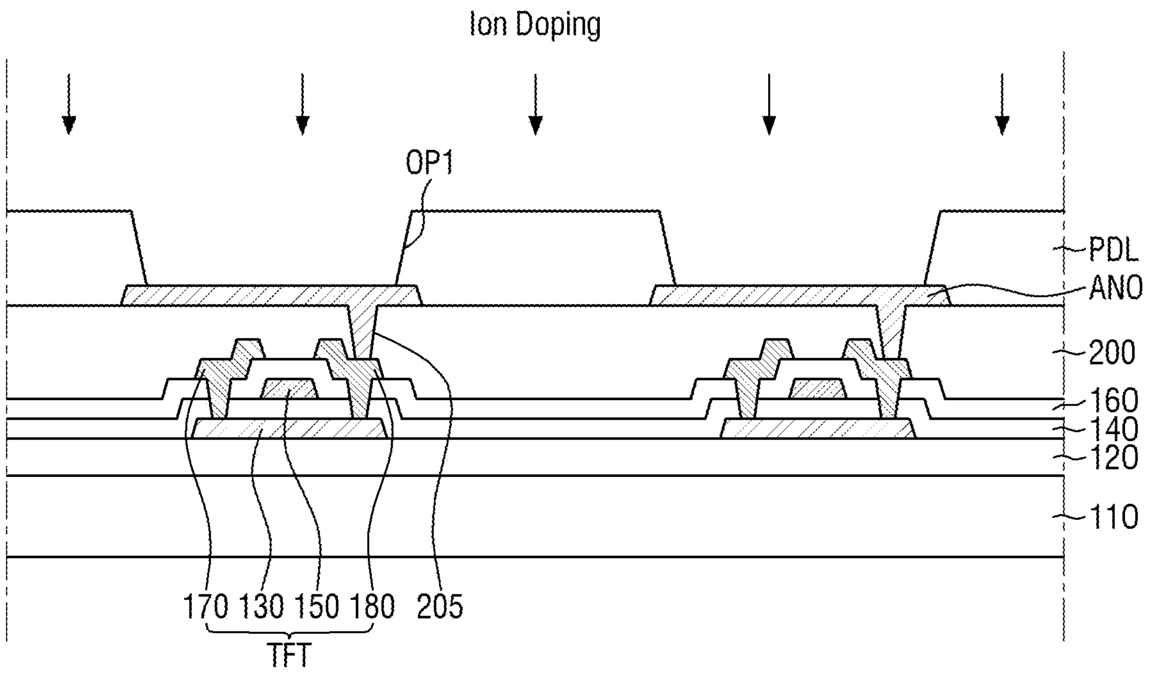

Subsequently, referring to FIGS. 14 and 15, an ion doping process may be conducted on the pixel-defining film PDL formed on the substrate 110. In the ion doping process, the pixel-defining film PDL may be doped with ions. The ions may include boron ions. The ions may be doped with a dose in a range of 5 E15/cm$^2$ to 1 E16/cm$^2$. For example, the dose of boron ions may range from 5 E15/cm$^2$ to 1 E16/cm$^2$. In order for the first region DDL of the pixel-defining film PDL that exhibits black color to be easily formed, it may be desired or suitable that the doping dose of boron is 5 E15/cm$^2$ or more. In order to reduce the ion doping process time, it may be desired or suitable that the doping dose of boron is 1 E16/cm$^2$ or less. In some embodiments, the acceleration voltage of ion doping may range from 10 KeV to 20 KeV.

Figure 15:
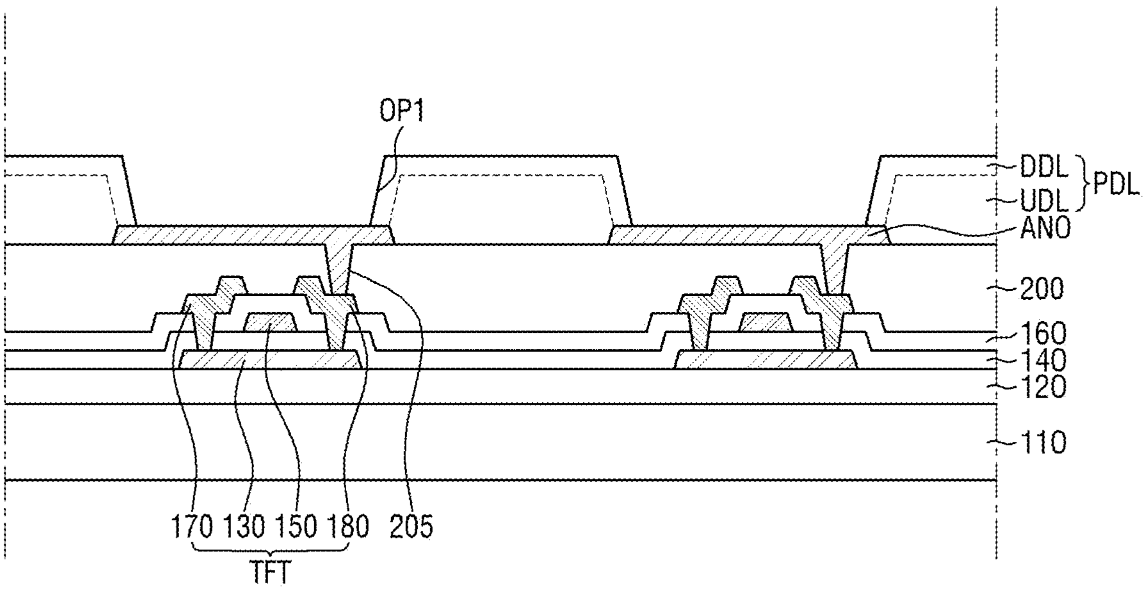

By conducting the ion doping on the pixel-defining film PDL as shown in FIG. 15, a first region DDL doped with ions can be formed at the surface of the pixel-defining film PDL, and a second region UDL not doped with the ions can be formed. Accordingly, it is possible to prevent or reduce reflection of external light by doping the pixel-defining film PDL with ions to form the first region DDL exhibiting black color so that external light is absorbed. Accordingly, it is possible to prevent or reduce a decrease in color gamut and to improve the issue of leakage current of a transistor due to external light.

Figure 16:
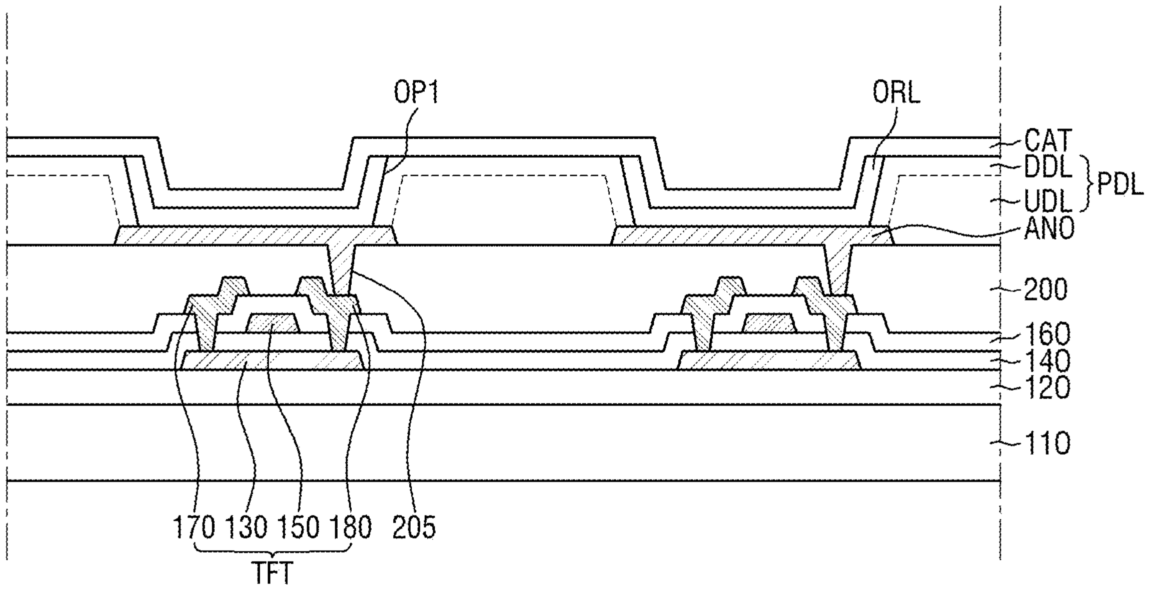

Subsequently, referring to FIG. 16, an organic layer ORL may be formed on the opening OP1 of the pixel-defining film PDL where the anode electrode ANO is exposed. The organic layer ORL may be disposed utilizing deposition and may include at least an emission material layer. At least one of a hole injection layer, a hole transport layer, an electron transport layer, or an electron injection layer may be further formed.

Subsequently, a cathode electrode CAT may be formed on the entire surface of the substrate 110. The cathode electrode CAT may be deposited on the entire surface of the substrate 110 by deposition. The cathode electrode CAT may be stacked on the organic layer ORL and the pixel-defining film PDL. In this manner, the display device 10 according to some embodiments can be fabricated.

FIGS. 17 to 20 are views showing processing steps of a method of fabricating a display device according to another embodiment of the present disclosure. FIGS. 17 to 20 show a method of fabricating the display device shown in FIG. 10 according to some embodiments. Some of the processes described above with reference to FIGS. 11 to 16 may not be repeated.

Figure 17:
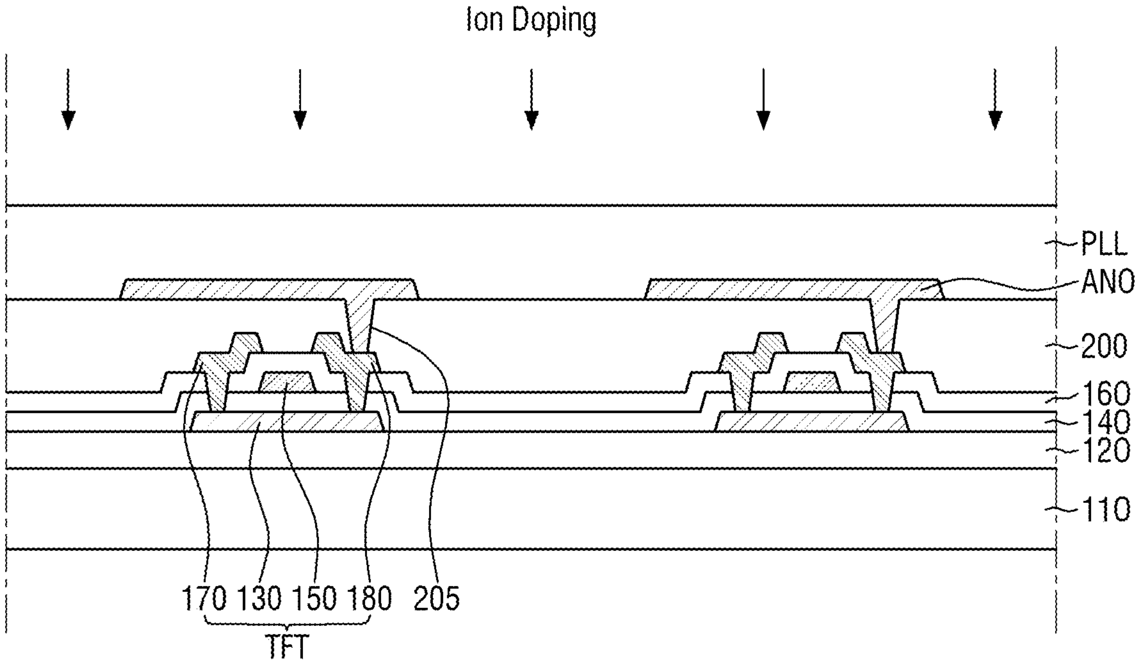
FIGS. 17-20 are views showing processing steps of a method of fabricating a display device according to another embodiment of the present disclosure.
Figure 18:
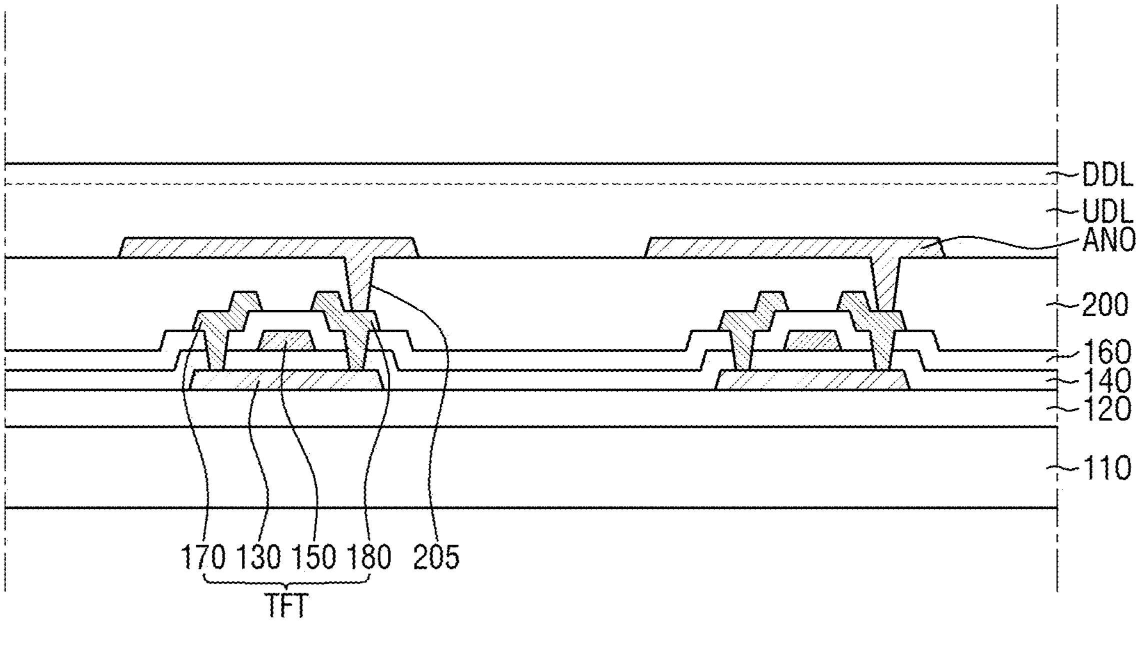

Referring to FIGS. 17 and 18, by conducting an ion doping process on an organic material layer PLL applied on the substrate 110, a first region DDL and a second region UDL can be formed in the organic material layer PLL. This embodiment is different from the embodiment of FIGS. 11 to 16 in that the ion doping process is conducted before the organic material layer PLL is patterned.

As the ion doping process is conducted before the organic material layer PLL is patterned, the upper portion of the organic material layer PLL is doped with ions to form the first region DDL, while the lower portion other than the first region DDL is not doped with the ions to form the second region UDL.

Figure 19:
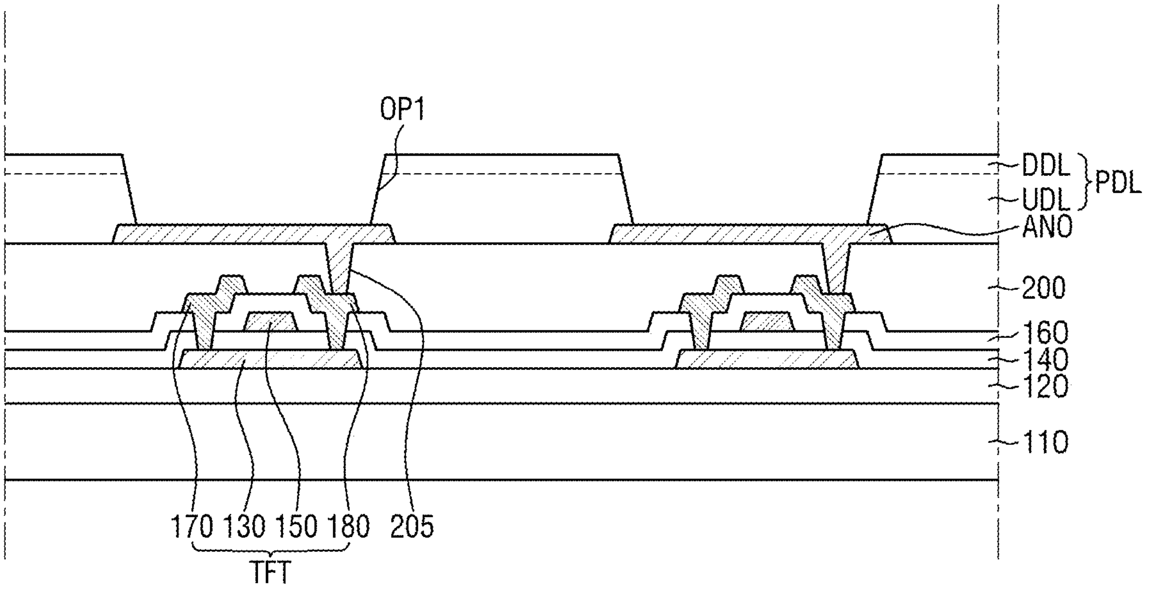

Subsequently, referring to FIG. 19, the organic material layer PLL may be patterned utilizing the above-described mask to form a pixel-defining film PDL. As a result, the first region DDL may be formed only at the upper portion of the pixel-defining film PDL, whereas the second region UDL may be formed at the lower portion of the pixel-defining film PDL. In other words, the first region DDL may form the upper portion of the pixel-defining film PDL, and the second region UDL may form the lower portion of the pixel-defining film PDL.

Figure 20:
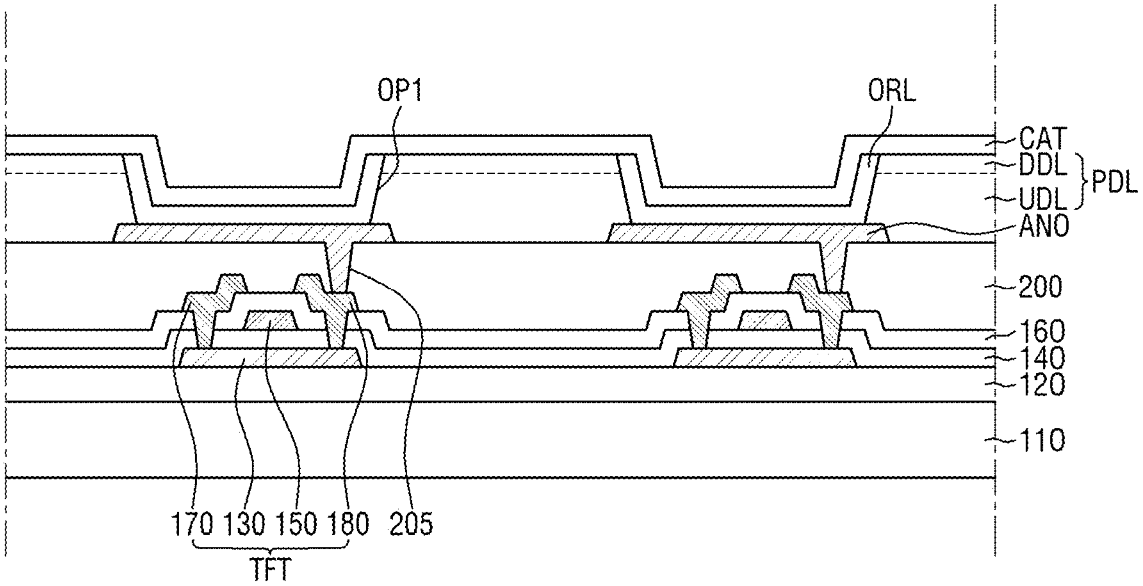

Subsequently, as shown in FIG. 20, an organic layer ORL and a cathode electrode CAT may be formed on the pixel-defining film PDL formed on the substrate 110, so that the display device 10 according to this embodiment can be fabricated.

As described above, by conducting the ion doping on the pixel-defining film PDL, the first region DDL doped with ions is formed at the surface of the pixel-defining film PDL, and a second region UDL not doped with the ions is formed. Accordingly, it is possible to prevent or reduce reflection of external light by doping the pixel-defining film PDL with ions to form the first region DDL exhibiting black color so that external light is absorbed. Accordingly, it is possible to prevent or reduce a decrease in color gamut and to improve the issue of leakage current of a transistor due to external light.

Figure 21:
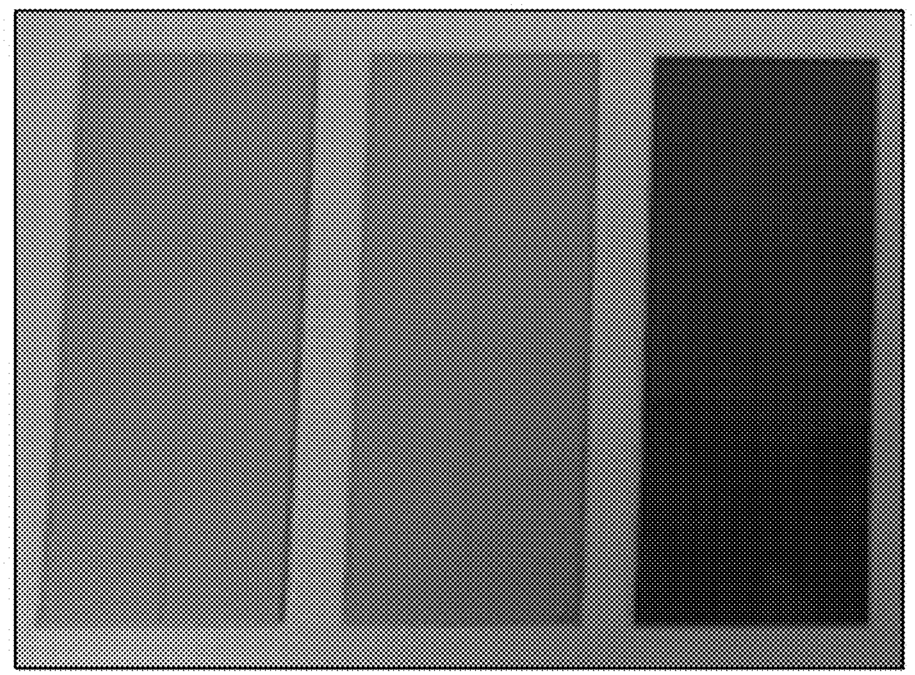
FIG. 21 shows images of pixel-defining films according to Comparative Example and embodiments.

FIG. 21 shows images of pixel-defining films according to Comparative Example and embodiments. In FIG. 21, the pixel-defining film according to Comparative Example is the left image, the pixel-defining film according to the first embodiment is the middle image, and the pixel-defining film according to the second embodiment is the right image.

Referring to FIG. 21, a novolak resin was coated as a pixel-defining film on a substrate. No ion is doped in Comparative Example. Boron ions were doped at the acceleration voltage of 10 KeV and with the dose of 1 E14/cm$^2$ in the first embodiment. Boron ions were doped at the acceleration voltage of 10 KeV and with the dose of 1 E16/$cm^2$ in the second embodiment.

As can be seen from FIG. 21, the color of the pixel-defining films according to Comparative Example and the first embodiment was not changed, while the pixel-defining film according to the second embodiment exhibited black color. The optical density of the pixel-defining film according to the second embodiment was 0.78. It can be seen from the above that the pixel-defining film exhibiting black color can be formed by doping the boron ions.

In concluding the detailed description, those skilled in the art will appreciate that many variations and modifications can be made to the example embodiments without substantially departing from the principles of the present disclosure. Therefore, the disclosed example embodiments of the present disclosure are utilized in a generic and descriptive sense only and not for purposes of limitation.

What is claimed is:

1. A display device comprising:
- a substrate;
- a via layer on the substrate;
- an anode electrode on the via layer;
- a pixel-defining film on the via layer and the anode electrode, and exposing a portion of the anode electrode;
- an organic layer on the anode electrode; and
- a cathode electrode on the organic layer,
- wherein the pixel-defining film comprises a first region comprising boron, and a second region other than the first region, and
- wherein the first region forms a concentration gradient in which a concentration of the boron decreases from a surface of the pixel-defining film to the second region.

2. The display device of claim 1, wherein the first region is adjacent to the cathode electrode, and the second region is adjacent to the anode electrode.

3. The display device of claim 1, wherein the first region is not in contact with a top surface of the via layer, and the second region is in contact with the top surface of the via layer.

4. The display device of claim 1, wherein the first region covers the second region.

5. The display device of claim 1, wherein a thickness of the second region is larger than a thickness of the first region.

6. The display device of claim 1, wherein a thickness of the first region is in a range of 0.005% to 0.025% of a thickness of the pixel-defining film.

7. The display device of claim 1, wherein an optical density of the pixel-defining film is in a range of 0.7 to 1.

8. The display device of claim 1, wherein the pixel-defining film has an opening exposing a portion of the anode electrode, and
- the first region comprises an inner circumferential surface of the opening.

9. The display device of claim 1, wherein the first region is parallel to a top surface of the via layer.

10. The display device of claim 1, wherein the pixel-defining film has an opening exposing a portion of the anode electrode, and
- the second region comprises at least part of an inner circumferential surface of the opening.

11. A method of fabricating a display device, the method comprising:
- forming a via layer on a substrate;
- forming an anode electrode on the via layer;
- forming an organic material layer on the via layer and the anode electrode;
- patterning the organic material layer to form a pixel-defining film exposing the anode electrode;
- doping the pixel-defining film with boron to form a first region of the pixel-defining film comprising the boron, and a second region of the pixel-defining film other than the first region, the first region forming a concentration gradient in which a concentration of the boron decreases from a surface of the pixel-defining film to the second region;
- forming an organic layer on the anode electrode; and
- forming a cathode electrode on the organic layer.

12. The method of claim 11, wherein the second region is not doped with the boron.

13. The method of claim 11, wherein a dose of the boron is in a range of 5E15/$cm^2$ to 1E16/$cm^2$.

14. The method of claim 11, wherein the doping the pixel-defining film with boron comprises doping the boron at an acceleration voltage of 10 KeV to 20 KeV.

15. A method of fabricating a display device, the method comprising:
- forming a via layer on a substrate;
- forming an anode electrode on the via layer;
- forming an organic material layer on the via layer and the anode electrode;
- doping the organic material layer with boron to form a first region of the organic material layer comprising the boron, and a second region of the organic material layer other than the first region, the first region forming a concentration gradient in which a concentration of the boron decreases from a surface of the organic material layer to the second region;
- patterning the organic material layer to form a pixel-defining film exposing the anode electrode;
- forming an organic layer on the anode electrode; and
- forming a cathode electrode on the organic layer.

16. The method of claim 15, wherein the second region is not doped with the boron.

17. The method of claim 16, wherein the first region is formed parallel to a top surface of the via layer.

18. The method of claim 15, wherein a dose of the boron is in a range of 5E15/$cm^2$ to 1E16/$cm^2$.

19. The method of claim 15, wherein the doping the organic material layer with boron comprises doping the boron at an acceleration voltage of 10 KeV to 20 KeV.

* * * * *